United States Patent [19]
Albanese

[11] 4,081,670
[45] Mar. 28, 1978

[54] AUTOMATIC BIAS CONTROL CIRCUIT FOR INJECTION LASERS

[75] Inventor: Andres Albanese, Matawan, N.J.

[73] Assignee: Bell Telephone Laboratories, Incorporated, Murray Hill, N.J.

[21] Appl. No.: 739,575

[22] Filed: Nov. 8, 1976

[51] Int. Cl.² ............................................. H04B 9/00
[52] U.S. Cl. .................................................. 250/199
[58] Field of Search ......................................... 250/199

[56] References Cited
U.S. PATENT DOCUMENTS 4,019,048  4/1977  Maione et al. ...................... 250/199

*Primary Examiner*—Richard Murray
*Attorney, Agent, or Firm*—Stephen M. Gurey

[57] ABSTRACT

An injection laser is automatically stabilized so that the laser operates above threshold when the laser current is modulated. The invention makes use of the fact that the laser junction voltage saturates at currents above the threshold. A signal which modulates the laser current and causes the laser current to fall below the threshold level therefore results in a change in the junction voltage. These changes in the junction voltage are monitored and used to increase the bias current so that the laser operates above threshold.

8 Claims, 4 Drawing Figures

AUTOMATIC BIAS CONTROL CIRCUIT FOR INJECTION LASERS

BACKGROUND OF THE INVENTION

This invention relates to control circuits for injection lasers and, more particularly, to a control circuit for automatically adjusting the bias of an injection laser.

Information can be transmitted on the output light of an injection laser by modulating the current through the laser in accordance with the transmitting signal, the latter being either an ac sinusoidal signal or a pulse train. In order, however, for the output light to be linearly related to the magnitude of the input modulating signal, the laser current must remain above the threshold level for all modulating input signal magnitudes. If the modulating signal causes the laser current to fall below the threshold level, the output light is "clipped" and when the modulated light is detected by a receiver, the recovered signal is a distorted replica of the modulating signal. Furthermore, the threshold level of an injection laser drifts as the laser ages and is a function of the ambient temperature. A signal which modulates the laser current without distortion at one point in time and at one temperature may drive the laser current below the threshold level due to a threshold drift. Accordingly, the laser must be biased with a dc current such that the laser current, when modulated, remains above the threshold level.

Prior art circuits have automatically adjusted the bias of an injection laser by optically detecting the output light of the laser and deriving a feedback signal to control the bias of the laser by comparing the electrical signal at the output of the optical detector with the input modulating signal. The use of an optical detector, however, requires that one face of the laser be accessible for feedback purposes or requires apparatus to divert a portion of the useful light output of the laser. Moreover, an optical link in the feedback network increases the complexity and cost of the control apparatus.

An object of the present invention is to automatically stabilize the bias current of an injection laser such that the laser operates above the threshold level.

SUMMARY OF THE INVENTION

In accordance with the present invention, the laser bias is automatically adjusted so that the laser operates above threshold when the laser current is modulated. The invention makes use of the fact that the laser junction voltage saturates at currents above threshold. Variations that cause the laser current to fall below threshold thus produce a change in the laser junction voltage. Changes in the laser junction voltage, designated as an error voltage, thus indicate that the laser is operating below threshold. The automatic bias control circuit of the present invention monitors changes in the junction voltage and automatically increases the bias current, by means of a feedback loop, until the laser junction voltage again saturates.

It is a feature of the present invention that only electronic circuitry is employed to automatically adjust the bias current for all modulating signal magnitudes and that no optical link is needed in the feeback loop to control the laser bias.

It is a further feature of the present invention that the circuit adjusts the laser current to compensate for the drift of the laser threshold due to changes in laser temperature and laser aging.

It is an additional feature of the present invention that the minimum bias current necessary to operate the laser above threshold is provided so as to minimize the power output of the laser.

DETAILED DESCRIPTION

Figure 1A:
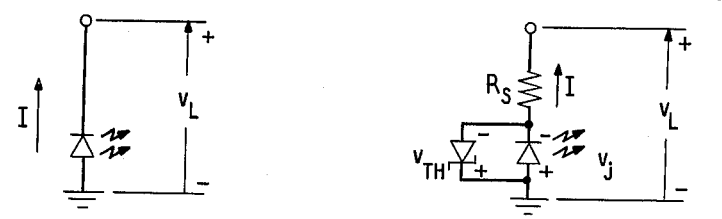
FIG. 1A shows a circuit representation of an injection laser and its equivalent representation as a resistor in series with the parallel combination of an ideal diode and a zener diode.

As aforenoted, the present invention makes use of the fact that the laser junction voltage saturates at currents above the laser's threshold level. With reference to FIG. 1A, the commonly used circuit representation of an injection laser is shown together with its equivalent circuit representation as the parallel combination of an ideal diode and a zener diode in series with a resistance $R_s$, where $R_s$ is the internal series resistance of the laser. The laser junction voltage $v_j$ is the voltage between the cathode and anode of the ideal diode and, in accordance with the polarities shown in FIG. 1A, the actual laser voltage across the laser, $v_L$, is given by:

$$v_L = -v_j - R_s I \tag{1}$$

wherein $I$ is the laser current.

When the laser is operated above the threshold level, the zener diode clips the laser junction voltage $v_j$ at a constant dc voltage $v_{TH}$ for all current values. The laser voltage therefore is linearly related to the current through the series resistance $R_s$. When, however, the laser current falls below the threshold level, the laser junction voltage $v_j$ falls below its saturation level $v_{TH}$. The magnitude of an input signal modulating the laser current and causing the laser current to fall below the threshold level thus induces changes in the laser junction voltage. These voltage changes in the laser junction voltage, to be labeled hereinafter as the error voltage, are used to increase the bias current of the laser and drive laser operation into the region above threshold. As will be described hereinafter, the automatic bias control circuit of the present invention provides the minimum bias current necessary for the laser to operate above threshold and thereby minimizes the light power output of the laser.

Figure 1B:
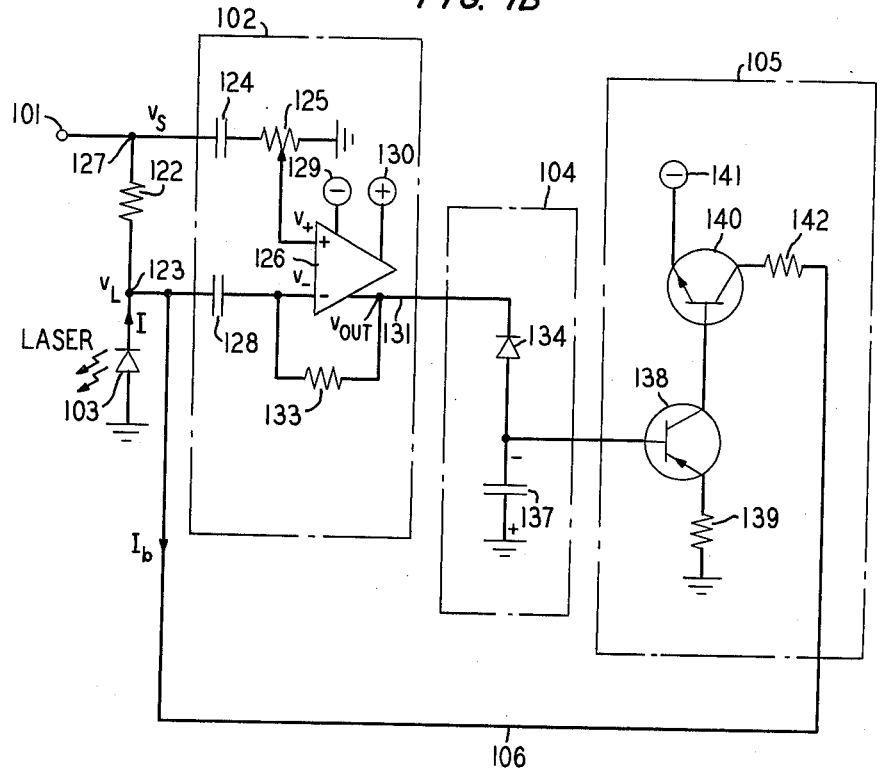
FIG. 1B shows an automatic bias control circuit embodying the principles of the present invention.

Briefly, with reference to FIG. 1B, an input modulating signal on terminal 101 provides an ac current to an aluminum-gallium-arsenide injection laser 103. The laser voltage $v_L$ across laser 103 is coupled to operational amplifier circuit 102. As will be described in detail hereinafter, the operational amplifier circuit 102 blocks the dc component of the laser voltage, eliminates the component of the laser voltage due to the voltage drop across the internal resistance $R_s$ of the laser, and amplifies the resultant voltage. The output of operational amplifier 102 is thus proportional to the ac component of the laser junction voltage $v_j$ (i.e., the error voltage). The maximum amplitude of the amplified error voltage is determined by an envelope detector 104. In response to the maximum amplitude of the amplified error voltage, a current source 105 produces a bias current $I_b$ on lead 106 so that the modulated laser current remains above threshold and the magnitude of the error voltage is driven toward zero. The feedback loop which includes operational amplifier 102, envelope detector 104, current source 105 and lead 106, maintains the bias current of laser 103 at a level to minimize the error voltage and thereby keep the laser operating above threshold for a wide range of modulating signal magnitudes and changes in the laser threshold due to aging and temperature variations.

Figure 2:
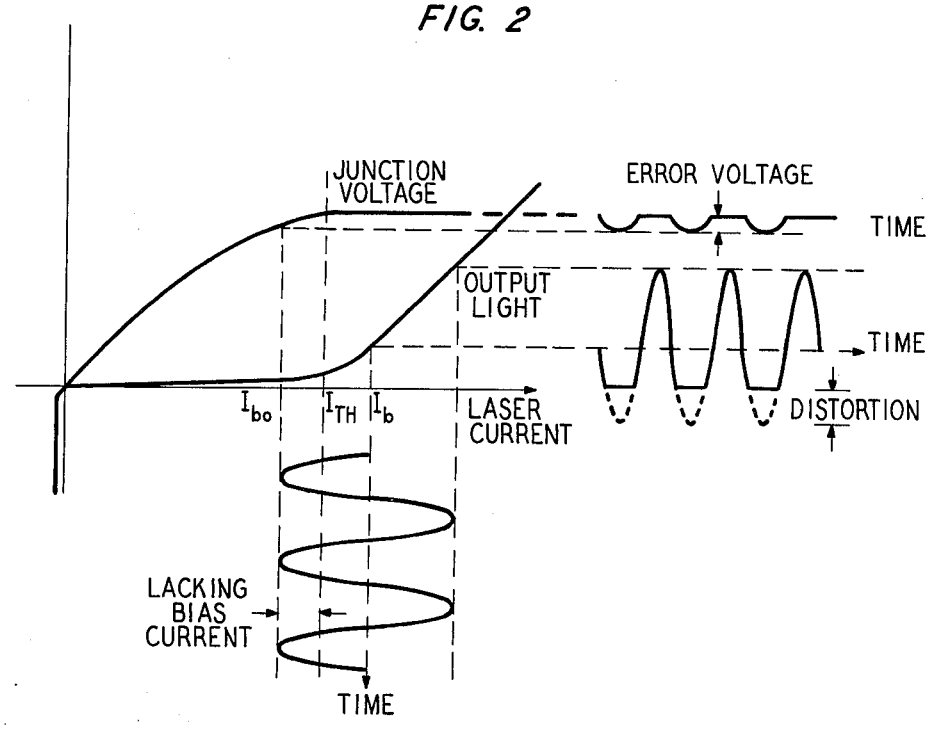
FIG. 2 shows the relationships between laser current and the laser output light and the laser junction voltage; in addition, a hypothetical ac signal is shown modulating the laser current; the resultant output light generated by the laser and the changes in the laser's junction voltage when the laser current falls below the threshold are also shown.

With reference to FIG. 2, the relationships between the laser current and the laser output light and the laser junction voltage are shown. In addition, a hypothetical signal which modulates the laser current below the threshold level $I_{TH}$ and the resultant output light and error voltage are shown. As can be noted, the output light of an injection laser is essentially zero until the laser current reaches the threshold level $I_{TH}$ whereupon stimulated emission commences. When the laser current is increased above $I_{TH}$, the output light power and laser current are essentially linearly related. Therefore, a signal which modulates the laser current above the threshold produces variations in the output light of the laser which are linearly related to the modulating signal.

The laser junction voltage is a logarithmic function for currents below threshold. Above threshold, the laser junction voltage saturates and remains essentially a constant for all laser currents.

As shown in FIG. 2, when the magnitude of the modulating signal is sufficiently large, the laser current falls below threshold to a level $I_{bo}$. The region below threshold between $I_{bo}$ and $I_{TH}$ is designated as lacking bias current. As can be noted, the output light is zero and is thus distorted for all time intervals in which the laser current lacks bias current. During these time intervals the laser junction voltage falls below the saturated level. As can be noted in FIG. 2, these changes in the junction voltage when the laser current lacks bias current produce an error voltage. As previously described hereinabove, and as will be described in detail hereinafter, the error voltage increases the bias current $I_b$ of the laser by an amount equal to the difference between $I_{TH}$ and $I_{bo}$ and thereby decreases the error voltage. The laser current is thus modulated above the threshold level $I_{TH}$.

The operation of the automatic bias control circuit shown in FIG. 1B will now be described in detail. An input modulating current signal is applied to terminal 101 and coupled through a resistor 122 to laser 103. The voltage at node 123 is the laser voltage $v_L$ and, as aforenoted, is equal to $-v_j - R_sI$, where I is the total laser current. The voltage at node 127, $v_s$, is equal to the laser voltage $v_L$ minus the voltage drop across resistor 122, the latter having a resistance $R_{122}$. Operational amplifier circuit 102 includes a standard differential amplifier 126 biased by negative and positive dc voltage sources 129 and 130, respectively. A feedback connection between the output of differential amplifier 126 on lead 131 and the negative input of the amplifier is provided by means of resistor 133, having a value $R_{133}$, to set the gain of differential amplifier 126. The voltage on lead 131 is thus equal to the difference between the voltages at the positive and negative inputs of the amplifier 126 times the gain of differential amplifier 126, where the gain is given by $R_{133}/R_s$.

Capacitor 124 blocks the dc component of voltage $v_s$ and an adjustable resistor 125 attenuates the resultant ac component of $v_s$ by a factor of $k$, where $k$ is less than one. The voltage at the positive input of amplifier 126 is thus given by:

$$v_+ = kv_{s(ac)} \qquad (2)$$

$$v_+ = (-v_{j(ac)} - (R_s + R_{122})I_{(ac)})k \qquad (3)$$

wherein $I_{(ac)}$ is the ac component of the laser current and $v_{j(ac)}$ is the ac component of the junction voltage. Capacitor 128 blocks the dc component of the laser voltage $v_L$ so that the voltage at the negative input of differential amplifier 126 is given by:

$$v_- = v_{L(ac)} \qquad (4)$$

$$= -v_{j(ac)} - R_sI_{(ac)}. \qquad (5)$$

The output of amplifier 126 is equal to the difference between $v_+$ and $v_-$ multiplied by $R_{133}/R_s$ and is given by:

$$v_{out} = [v_{j(ac)}(1-k) + I_{(ac)}(R_s - (R_s + R_{122})k] \\ (R_{133}/R_s). \qquad (6)$$

By adjusting resistor 125 so that $$k = (R_s/(R_s+R_{122})), \qquad (7)$$

the output of amplifier 126 can be made independent of the laser current. The output of amplifier 126 is thus given by:

$$v_{out} = (v_{j(ac)}(1-k))(R_{133}/R_s). \qquad (8)$$

For typical resistive values of $R_s \approx 2$ ohms, and $R_{122} \approx 50$ ohms and $R_{133} = 100$ kilohms $$v_{out} \approx 48,000 \, v_{j(ac)}. \qquad (9)$$

Therefore, the output of differential amplifier 126 is proportional to the ac component of the laser junction voltage and is thus proportional to the aforedefined error voltage. When the laser operates above threshold the laser junction voltage is constant and $v_{out}$ is zero.

As noted, resistor 125 must be adjusted to make the output of amplifier 126 independent of the laser current. Accordingly, as will be described in detail hereinbelow, the automatic bias control circuit of the present invention is initially calibrated by adjusting resistor 125.

The error voltage output of amplifier 126 is an ac signal having a zero dc component. When the error voltage is negative, current flows through diode 134 and charges a capacitor 137 within envelope detector 104. The resultant voltage across capacitor 137 is a dc voltage proportional to the peak magnitude of the voltage at the output of differential amplifier 126. The voltage across capacitor 137 is applied to the base of a pnp transistor 138 within current source 105. The emitter of transistor 138 is connected through resistor 139 to ground and the collector of transistor 138 is connected to the base of an npn transistor 140. The emitter of transistor 140 is connected to a negative dc voltage supply 141 and the collector of transistor 140 is connected through a resistor 142 to laser 103 on lead 106. As the voltage across capacitor 137 increases, the current in the collector-emitter path of transistor 138 also increases. Transistor 140, acting as a current multiplier, transforms the increase in its base current into an increase in the current through its collector-emitter path. Transistor 140, connected to laser 103 via lead 106 supplies the dc bias current $I_b$ to the laser.

The voltage across capacitor 137, which is proportional to the peak of the error voltage, thus causes current source 105 to generate a bias current $I_b$. As the bias current is increased, the error voltage decreases. The feedback loop, including operational amplifier circuit 102, envelope detector 104, current source 105 and lead 106, automatically stabilizes the laser bias current so as to minimize the error voltage and cause the laser to operate above threshold. For optimum performance, the current source 105 should have the maximum transfer ratio between the current output and voltage input.

If the magnitude of the modulating current signal on terminal 101 increases, the error voltage and the voltage across capacitor 137 increases. The increase in the base voltage of transistor 138 increases the collector-emitter current which in turn increases the collector-emitter current of transistor 140 and thus the bias current level of the laser. The automatic bias control circuit is thus capable of adjusting the bias current level for a wide range of modulating signal magnitudes. In addition, since the bias current is adjusted only until the error voltage is minimized, the modulating signal modulates the laser current over the region which abuts the threshold level. Therefore, no excess light power output is generated by the laser. As can be readily seen with reference to FIG. 2, the bias current $I_b$ supplied by current source 105 is a function of the threshold level and the magnitude of the modulating signal.

As a laser ages or undergoes temperature fluctuations, the threshold level of the laser is likely to vary. A signal which previously modulated the laser current above threshold may thus commence to modulate the laser current into the region below threshold. The resultant signal at the output of differential amplifier 126 adjusts the output of current source 105 to rebias the laser for the new threshold level.

As aforenoted, the automatic bias control circuit must be calibrated prior to operation to make the output of differential amplifier independent of the laser current. In order to calibrate the automatic bias control circuit, a dc voltage supply is connected directly to laser 103 to provide a dc bias current above threshold to the laser. A modulating signal is applied to terminal 101 to modulate the laser current above threshold and the output of differential amplifier 126 is examined. Since the laser current is above threshold, the laser junction voltage $v_j$ remains saturated. Therefore, when resistor 125 is properly adjusted, the output of differential amplifier 126 is zero. The output of differential amplifier 126 will thereafter be proportional to only the ac component of the laser junction voltage and will be independent of the laser current.

Figure 3:
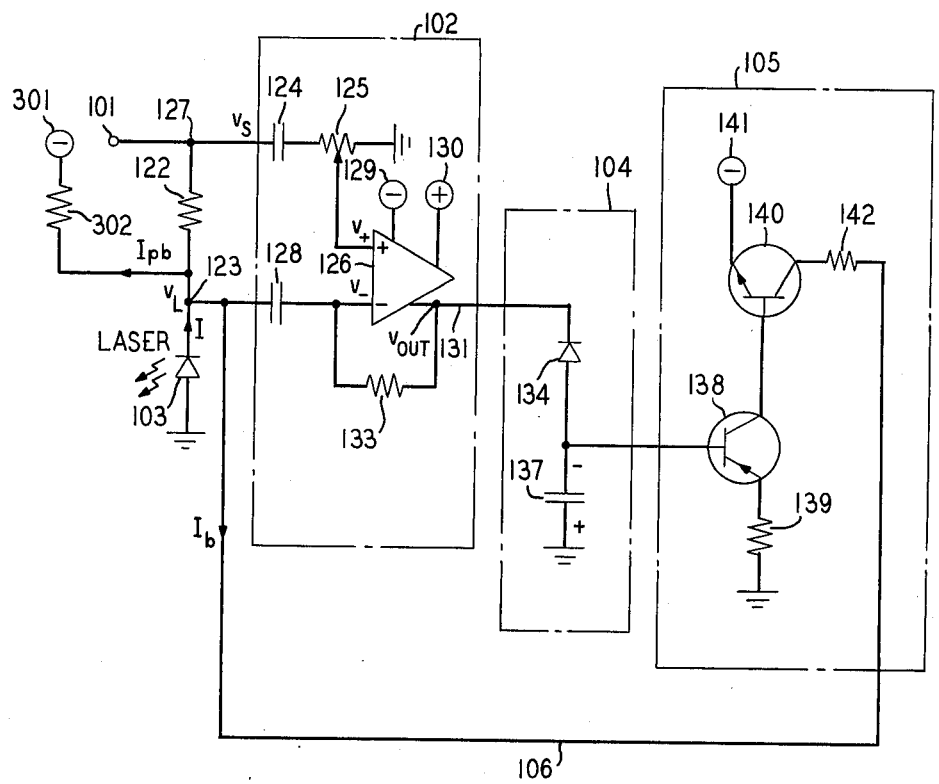
FIG. 3 shows a second embodiment of the automatic bias control circuitry of the present invention.

FIG. 3 shows a second embodiment of the present invention that is similar to the embodiment of the present invention shown in FIG. 1B. The same numerical designations are given to those circuit elements in FIG. 3 that correspond with circuit elements in FIG. 1B.

With reference to FIG. 3, a dc voltage supply 301 is connected through a resistor 302 to laser 103 to supply a prebias current to the laser. This prebias current $I_{pb}$ is below the threshold level of the laser. When an input modulating signal is applied to terminal 101 and an error voltage developed by operational amplifier circuit 102, a smaller bias current $I_b$ is required from current source 105 to bias the laser above the threshold level. Prebiasing the laser below the threshold improves the response time of the circuit and lowers the current requirements for the transistors that form the current source, since they must now only provide a smaller current. The current supplied by current source 105 will thus be a function of the threshold level, the magnitude of the modulating signal and the prebias current. The automatic bias control shown in FIG. 3 otherwise operates in an identical manner to the automatic bias control shown in FIG. 1B.

Various other modifications of the invention can be made without departing from the spirit and scope of the present invention. Although it has been assumed in the previous descriptions that an ac sinusoidal current signal is applied to terminal 101, the present invention also functions equally as well when a digital pulse train modulates the laser current between two or more discrete current levels. Accordingly, the present invention can be used when the laser is employed to transmit digital information signals, as well as frequency or phase modulated signals.

The above-described arrangements are illustrative of the application of the principles of the invention. Other embodiments may be devised by those skilled in the art without departing from the spirit and scope thereof.

What is claimed is:

1. An automatic bias control circuit for an injection laser which laser current is modulated in response to a modulating signal comprising:
   means for deriving an error voltage directly from changes in the junction voltage of the laser generated in response to the modulated current through said laser; and
   means for adjusting the laser bias current in response to said error voltage so that the modulated laser current remains above the threshold level of the laser.

2. An automatic bias control circuit in accordance with claim 1 wherein said means for deriving an error voltage includes means for electrically eliminating from the voltage across the laser the voltage drop across the internal resistance of the laser.

3. An automatic bias control circuit in accordance with claim 1 wherein said means for adjusting the laser bias current includes an envelope detector for determining the maximum amplitude of the error voltage, the laser bias current being adjusted in response to the maximum amplitude of the error voltage.

4. An automatic bias control circuit in accordance with claim 3 wherein said means for adjusting the laser bias current further includes a current source responsive to the maximum amplitude of said error voltage for generating a current for biasing said laser, the magnitude of said current for biasing being determined by the magnitude of the modulating signal and the threshold level of the laser.

5. An automatic bias control circuit for an injection laser which laser current is modulated in response to a modulated signal comprising:

means for prebiasing said laser with a prebias current having a magnitude below the laser threshold level;

means for deriving an error voltage directly from changes in the junction voltage of the laser generated in response to the modulated current through said laser; and means for adjusting the laser bias current in response to said error voltage so that the modulated laser current remains above the threshold level of the laser.

6. An automatic bias control circuit in accordance with claim 5 wherein said means for deriving an error voltage includes means for electrically eliminating from the voltage across the laser the voltage drop across the internal resistance of the laser.

7. An automatic bias control circuit in accordance with claim 5 wherein said means for adjusting the laser bias current includes an envelope detector for determining the maximum amplitude of the error voltage, the laser bias current being adjusted in response to the maximum amplitude of the error voltage.

8. An automatic bias control circuit in accordance with claim 7 wherein said means for adjusting the laser bias current further includes a current source responsive to the maximum amplitude of said error voltage for generating a current additional to said prebias current, the magnitude of the additional current generated being determined by the magnitudes of the modulating signal and the prebias current, and the threshold level of the laser.

* * * * *